US010921618B2

(12) United States Patent
Lee et al.

(10) Patent No.: US 10,921,618 B2
(45) Date of Patent: Feb. 16, 2021

(54) OPTICAL MODULATING DEVICE AND APPARATUS INCLUDING THE SAME

(71) Applicants: SAMSUNG ELECTRONICS CO., LTD., Suwon-si (KR); CALIFORNIA INSTITUTE OF TECHNOLOGY, Pasadena, CA (US)

(72) Inventors: Duhyun Lee, Yongin-si (KR); Ruzan Sokhoyan, Pasadena, CA (US); Yu-Jung Lu, Pasadena, CA (US); Ghazaleh Kafaie Shirmanesh, Pasadena, CA (US); Harry Atwater, Pasadena, CA (US); Ragip Pala, Pasadena, CA (US); Chanwook Baik, Yongin-si (KR)

(73) Assignees: SAMSUNG ELECTRONICS CO., LTD., Suwon-si (KR); CALIFORNIA INSTITUTE OF TECHNOLOGY, Pasadena, CA (US)

( * ) Notice: Subject to any disclaimer, the term of this patent is extended or adjusted under 35 U.S.C. 154(b) by 184 days.

(21) Appl. No.: 16/170,573

(22) Filed: Oct. 25, 2018

(65) Prior Publication Data
US 2019/0129206 A1 May 2, 2019

Related U.S. Application Data

(60) Provisional application No. 62/579,220, filed on Oct. 31, 2017.

(30) Foreign Application Priority Data

Apr. 4, 2018 (KR) .................. 10-2018-0039338

(51) Int. Cl.
*G02F 1/017* (2006.01)
*H01S 5/183* (2006.01)
(Continued)

(52) U.S. Cl.
CPC .......... *G02F 1/01708* (2013.01); *B82Y 20/00* (2013.01); *G02F 1/015* (2013.01);
(Continued)

(58) Field of Classification Search
CPC ... G02F 1/01708; G02F 1/01716; G02F 1/015
See application file for complete search history.

(56) References Cited

U.S. PATENT DOCUMENTS 7,245,952 B2 7/2007 Cameron
8,803,741 B2 8/2014 Lam
(Continued)

FOREIGN PATENT DOCUMENTS

JP 2013-225088 A 10/2013
JP 2014-190975 A 10/2014

OTHER PUBLICATIONS

Communication dated Mar. 15, 2019, issued by the European Patent Office in counterpart European Application No. 18 195 394.4.

*Primary Examiner* — Douglas M Menz
(74) *Attorney, Agent, or Firm* — Sughrue Mion, PLLC

(57) ABSTRACT

An optical modulating device may include a plurality of quantum dot (QD)-containing layers having QDs and a plurality of refractive index change layers. The QD-containing layers may be disposed between the refractive index change layers, respectively. The optical modulating device may be configured to modulate light-emission characteristics of the plurality of QD-containing layers. At least two of the QD-containing layers may have different central emission wavelengths. At least two of the plurality of refractive index change layers may include different materials or have different carrier densities.

28 Claims, 16 Drawing Sheets

(51) Int. Cl.
  *G02F 1/015* (2006.01)
  *B82Y 20/00* (2011.01)
(52) U.S. Cl.
  CPC ...... *G02F 1/01716* (2013.01); *H01S 5/18302* (2013.01); *G02F 2001/0152* (2013.01); *G02F 2001/0156* (2013.01); *G02F 2001/0157* (2013.01); *G02F 2001/01791* (2013.01)

(56) References Cited

U.S. PATENT DOCUMENTS

| | | |
|---|---|---|
| 9,116,302 B2 | 8/2015 | McCarthy et al. |
| 9,581,854 B2 | 2/2017 | Ren et al. |
| 9,739,918 B2 | 8/2017 | Arbabi et al. |
| 9,740,032 B2 | 8/2017 | Park et al. |
| 2003/0206741 A1 | 11/2003 | Ledentsov et al. |
| 2004/0085612 A1* | 5/2004 | Livingston .......... G02F 1/01708 359/279 |
| 2004/0160171 A1* | 8/2004 | Takahashi .......... H01L 51/5262 313/504 |
| 2006/0067602 A1 | 3/2006 | Todori et al. |
| 2012/0307361 A1 | 12/2012 | Liu et al. |
| 2014/0085693 A1 | 3/2014 | Mosallaei et al. |
| 2015/0243849 A1 | 8/2015 | Stroetmann |
| 2016/0048043 A1 | 2/2016 | Palikaras et al. |
| 2016/0111782 A1 | 4/2016 | Alu et al. |
| 2016/0161644 A1 | 6/2016 | Verschuuren et al. |
| 2016/0341859 A1 | 11/2016 | Shvets et al. |
| 2017/0031183 A1 | 2/2017 | Han et al. |
| 2017/0084761 A1 | 3/2017 | Cho et al. |
| 2017/0235162 A1 | 8/2017 | Shaltout et al. |

* cited by examiner

OPTICAL MODULATING DEVICE AND APPARATUS INCLUDING THE SAME

CROSS-REFERENCE TO RELATED APPLICATIONS

This application claims priority from U.S. Provisional Patent Application No. 62/579,220, filed on Oct. 31, 2017 in the U.S. Patent and Trademark Office, and Korean Patent Application No. 10-2018-0039338, filed on Apr. 4, 2018 in the Korean Intellectual Property Office, the disclosures of which are incorporated herein in their entireties by reference.

BACKGROUND

1. Field

Example embodiments of the present disclosure relate to optical modulating devices and apparatuses including the same.

2. Description of the Related Art

Optical devices for changing the characteristics of light such as transmission/reflection, phase, amplitude, polarization, intensity, path, etc. of light are used in a variety of optical apparatuses. Optical modulators having various structures have been suggested to control the above characteristics of light in a desired method in an optical system. For example, liquid crystal having optical anisotropy or a micro-electromechanical system (MEMS) structure using a fine mechanical movement of a light blocking/reflection element is used for general optical modulators. Such optical modulators have a slow operation response time of over several microseconds (μs) due to the characteristics of a driving method.

SUMMARY

One or more example embodiments provide optical modulating devices which may adjust and/or modulate optical characteristics at high speed by using quantum dots as an optical modulating element.

One or more example embodiments also provide optical modulating devices which may emit light of a multi-wavelength region and more easily control and/or modulate the light.

One or more example embodiments also provide optical modulating devices which may multiplex light of a multi-wavelength region.

One or more example embodiments also provide apparatuses including the optical modulating devices.

According to an aspect of an example embodiment, there is provided an optical modulating device including a plurality of refractive index change layers, and a plurality of quantum dot (QD)-containing layers disposed between the plurality of refractive index change layers, respectively, wherein the optical modulating device is configured to modulate light-emission characteristics of the plurality of QD-containing layers.

The at least two of the plurality of QD-containing layers may have central emission wavelengths that are different from each other.

The plurality of QD-containing layers may include a first QD-containing layer and a second QD-containing layer, the first QD-containing layer may include first quantum dots and the second QD-containing layer may include second quantum dots, and the first quantum dots and the second quantum dots may include materials that are different from each other and/or have different sizes that are different from each other.

The at least two of the plurality of QD-containing layers may include thicknesses that are different from each other.

The each of the plurality of QD-containing layers may include an insulating layer and a plurality of quantum dots embedded in the insulating layer.

The at least two of the plurality of refractive index change layers may include materials that are different from each other.

The at least two of the plurality of refractive index change layers may have carrier densities that are different from each other.

The at least two of the plurality of refractive index change layers may have thicknesses that are different from each other.

The plurality of refractive index change layers may include at least one of a transparent conductive oxide and a transition metal nitride.

The optical modulating device may further include a signal application device configured to apply an electrical signal to the plurality of refractive index change layers, the optical modulating device being configured to change refractive indexes of the plurality of refractive index change layers based on the electrical signal applied by the signal application device.

The plurality of refractive index change layers and the plurality of QD-containing layers may form a stack structure, and the optical modulating device may further include a reflector disposed on a first surface of the stack structure, and a band-stop mirror disposed on a second surface, opposite to the first surface, of the stack structure.

The optical modulating device may further include a light source provided between the stack structure and the reflector and configured to emit light to optically excite quantum dots included in the plurality of QD-containing layers, respectively, or an optical waveguide disposed between the stack structure and the reflector and configured to guide light to optically excite the quantum dots included in the plurality of QD-containing layers.

The plurality of refractive index change layers and the plurality of QD-containing layers may form a stack structure, the optical modulating device may further include a light source provided on a surface of the stack structure and configured to emit light to optically excite quantum dots included in the plurality of QD-containing layers, or an optical waveguide provided on the surface of the stack structure and configured to guide light to optically excite the quantum dots included in the plurality of QD-containing layers.

The plurality of refractive index change layers and the plurality of QD-containing layers may form a stack structure, the optical modulating device further including a nano-antenna structure disposed on a first surface of the stack structure.

The nano-antenna structure may include one of a metallic antenna, a dielectric antenna, and a slit-containing structure.

The nano-antenna structure may include one of a multi-patch antenna structure and a fishbone shaped antenna structure.

The nano-antenna structure may include an output coupler.

The optical modulating device may further include a light source provided at a second surface, opposite to the first surface, of the stack structure and configured to emit light to optically excite quantum dots included in the plurality of QD-containing layers, or an optical waveguide provided at the second surface of the stack structure and configured to guide light to optically excite the quantum dots included in the plurality of QD-containing layers, wherein the stack structure is disposed between the nano-antenna structure and the light source or the optical waveguide.

The optical modulating device may further include a reflector disposed on the light source or the optical waveguide, and a band-stop mirror disposed between the stack structure and the nano-antenna structure.

An optical apparatus may include the optical modulating device.

According to another aspect of an example embodiment, there is provided an optical modulating device including a plurality of refractive index change layers, and a plurality of quantum dot (QD)-containing layers disposed between the plurality of refractive index change layers, the plurality of QD-containing layers including quantum dots (QDs), and at least two of the plurality of QD-containing layers having central emission wavelengths that are different from each other, wherein the optical modulating device is configured to modulate, based on a refractive index change of the plurality of refractive index change layers, light-emission characteristics of the plurality of QD-containing layers to have characteristics of emitting light of a plurality of wavelength regions.

The at least two of the plurality of refractive index change layers may include materials that are different from each other or include different carrier densities that are different from each other.

The plurality of refractive index change layers and the plurality of QD-containing layers may form a stack structure, the optical modulating device may further include a light source provided on a surface of the stack structure and configured to emit light to optically excite quantum dots included in the plurality of QD-containing layers, or an optical waveguide provided on the surface of the stack structure and configured to guide light to optically excite the quantum dots included in the plurality of QD-containing layers.

The plurality of refractive index change layers and the plurality of QD-containing layers may form a stack structure, wherein the optical modulating device further includes a reflector disposed on a first surface of the stack structure, and a band-stop mirror disposed on a second surface, opposite from the first surface, of the stack structure.

An optical apparatus may include the optical modulating device.

The nano-antenna structure may further include an input coupler.

According to another aspect of an example embodiment, there is provided an optical modulating device including a plurality of refractive index change layers, a plurality of quantum dot (QD)-containing layers disposed between the plurality of refractive index change layers, respectively, and a signal application device configured to apply an electrical signal to the plurality of refractive index change layers, respectively, wherein the optical modulating device is configured to change refractive indexes of the plurality of refractive index change layers based on the electrical signal applied by the signal application device to the plurality of refractive index change layers, and modulate light-emission characteristics of each of the plurality of QD-containing layers based on the changed refractive indexes of the plurality of refractive index change layers.

The plurality of QD-containing layers may include a plurality of quantum dots embedded in an insulating layer.

The plurality of refractive index change layers and the plurality of QD-containing layers may form a stack structure, the optical modulating device further including a nano-antenna structure disposed on a surface of the stack structure.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
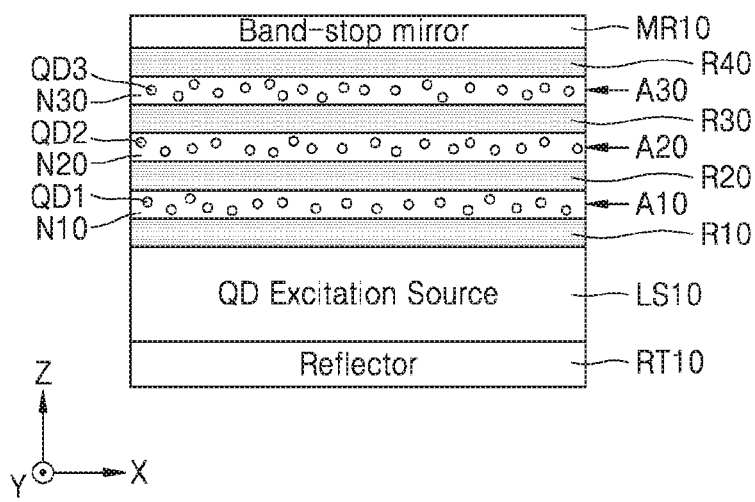
FIG. 1 is a cross-sectional view of an optical modulating device according to an example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to example embodiments of which are illustrated in the accompanying drawings, wherein like reference numerals refer to like elements throughout. Also, the size of each layer illustrated in the drawings may be exaggerated for convenience of explanation and clarity. In this regard, the present embodiments may have different forms and should not be construed as being limited to the descriptions set forth herein.

FIG. 1 is a cross-sectional view of an optical modulating device according to an example embodiment.

Referring to FIG. 1, a plurality of layers, each including a plurality of quantum dots (QDs), which is referred to as QD-containing layers, may be arranged apart from each other. For example, first to third QD-containing layers A10, A20, and A30 may be provided. However, example embodiments are not limited thereto, and the number of QD-containing layers is exemplary and may be changed. The first to third QD-containing layers A10, A20, and A30 may respectively include first to third insulating layers N10, N20, and N30 and a plurality of quantum dots QD1, QD2, and QD3 respectively embedded in the first to third insulating layers N10, N20, and N30. The quantum dots QD1 included in the first QD-containing layer A10 may be referred to as first QDs, the quantum dots QD2 included in the second QD-containing layer A20 may be referred to as second QDs, and the quantum dots QD3 included in the third QD-containing layer A30 may be referred to as third QDs. At least two of the first to third QD-containing layers A10, A20, and A30 may have different central emission wavelengths. In this regard, at least two of the first to third quantum dots QD1, QD2, and QD3 may include different materials and/or have different sizes. The central emission wavelengths of the first to third QD-containing layers A10, A20, and A30 may vary according to the material or size of the QDs. All of the first to third quantum dots QD1, QD2, and QD3 may have different central emission wavelengths. However, example embodiments are not limited thereto, and in some cases, at least two of the first to third quantum dots QD1, QD2, and QD3 may have the same central emission wavelength, where the at least two of the first to third quantum dots QD1, QD2, and QD3 may be substantially the same.

A plurality of refractive index change layers may be provided spaced apart from each other. For example, first to fourth refractive index change layers R10, R20, R30, and R40 may be provided, and the first to third QD-containing layers A10, A20, and A30 may be arranged between the first to fourth refractive index change layers R10, R20, R30, and R40. The first to fourth refractive index change layers R10, R20, R30, and R40 each may be a layer having a refractive index that is changed according to an electrical signal applied thereto or other conditional changes. The first to fourth refractive index change layers R10, R20, R30, and R40 may be layers in which permittivity is changed according to an electrical condition. A charge concentration (charge density) of an area(s) in the first to fourth refractive index change layers R10, R20, R30, and R40 may be changed according to an electric field applied to the first to fourth refractive index change layers R10, R20, R30, and R40. Accordingly, the permittivity of the first to fourth refractive index change layers R10, R20, R30, and R40 may be changed. For example, each of the first to fourth refractive index change layers R10, R20, R30, and R40 may include a transparent conductive oxide (TCO) such as indium tin oxide (ITO), indium zinc oxide (IZO), aluminium zinc oxide (AZO), gallium zinc oxide (GZO), aluminium gallium zinc oxide (AGZO), or gallium indium zinc oxide (GIZO), or a transition metal nitride such as titanium nitride (TiN), zirconium nitride (ZrN), hafnium nitride (HfN), or tantalum nitride (TaN). In addition, the first to fourth refractive index change layers R10, R20, R30, and R40 may include an electro-optic (EO) material whose effective permittivity is changed when an electrical signal is applied thereto. The EO material may include, for example, a crystal material such as lithium niobate (LiNbO$_3$), lithium tantalate (LiTaO$_3$), potassium tantalate niobate (KTN), or lead zirconate titanate (PZT), or various polymers having EO characteristics. The first to fourth refractive index change layers R10, R20, R30, and R40 may be a semiconductor, a conductor, or a dielectric. The first to fourth refractive index change layers R10, R20, R30, and R40 may be transparent or substantially transparent.

The first to fourth refractive index change layers R10, R20, R30, and R40 may be formed of the same material, and may have the same carrier density. By varying an electrical signal applied to the first to fourth refractive index change layers R10, R20, R30, and R40, or other conditions, the characteristics of the first to fourth refractive index change layers R10, R20, R30, and R40 may be independently controlled. According to example embodiments, at least two of the first to fourth refractive index change layers R10, R20, R30, and R40 may include different materials and/or may have different carrier densities. In this case, controlling the characteristics of the first to third QD-containing layers A10, A20, and A30 to be different from one another may be easier by using the first to fourth refractive index change layers R10, R20, R30, and R40.

The optical modulating device according to the example embodiment may be configured to modulate the light-emission characteristics of the first to third QD-containing layers A10, A20, and A30 based on a change in the refractive indexes of the first to fourth refractive index change layers R10, R20, R30, and R40. When the first to third QD-containing layers A10, A20, and A30 have different central emission wavelengths, the optical modulating device may emit light beams of a multi-wavelength region and the light beams of a multi-wavelength region may be independently controlled. Accordingly, an optical modulating device according to an example embodiment may emit light beams of a multi-wavelength region and more easily control the light beams. According to an example embodiment, an optical modulating device may multiplex the light beams of multiple wavelength regions. According to an example embodiment, a multiplexing optical modulating device may actively tune a light beam for each wavelength region.

The first to fourth refractive index change layers R10, R20, R30, and R40 and the first to third QD-containing layers A10, A20, and A30 may form a stack structure, as illustrated in FIG. 1. The optical modulating device may further include a reflector RT10 provided at a surface of the stack structure and a band-stop mirror MR10 provided at an opposite surface of the stack structure. Furthermore, the optical modulating device may further include, between the stack structure and the reflector RT10, a light source element LS10 to emit light to optically excite the first to third quantum dots QD1, QD2, and QD3 of the first to third QD-containing layers A10, A20, and A30.

The band-stop mirror MR10 may have reflection characteristics with respect to light of a specific wavelength region and transmission characteristics with respect to the wavelength regions other than the specific wavelength region. The band-stop mirror MR10 may have, for example, a distributed Bragg reflector (DBR) structure. Two dielectric layers having different refractive indexes may be repeatedly stacked under a λ/4 thickness condition, where λ is the wavelength of light, thereby increasing reflectivity or transmissivity of a desired wavelength region. However, example embodiments are not limited thereto, and the band-stop mirror MR10 may have a structure other than the DBR structure. The reflector RT10 may be formed of a conductor such as metal or may have a DBR structure. The reflector RT10 may be a back reflector electrode. The light source element LS10 may include an inorganic-based light-emitting device (iLED), an organic light-emitting device (OLED), or a laser diode (LD). Light to excite the first to third quantum dots QD1, QD2, and QD3, that is, excitation light, may be radiated from the light source element LS10 toward the first to third QD-containing layers A10, A20, and A30. The reflector RT10 and the band-stop mirror MR10 may be configured in a cavity structure such that the excitation light emitted from the light source element LS10 is internally reflected in the optical modulating device. Accordingly, the light source element LS10, the reflector RT10, and the band-stop mirror MR10 may increase luminous efficacy and modulation efficiency of the optical modulating device. The light emitted and modulated in the first to third QD-containing layers A10, A20, and A30 may be output (emitted) above the band-stop mirror MR10 by passing through the same.

The QDs applied to example embodiments, that is, the first to third quantum dots QD1, QD2, and QD3, may include semiconductor particles having a ball shape of a nanometer size or a shape similar thereto, and may have a size (diameter) of about several nanometers (nm) to about several tens of nanometers. A QD may have a monolithic structure or a core-shell structure. The core-shell structure may be a single shell structure or a multi-shell structure. For instance, the core-shell structure may include a core part, which is a central body of a QD, formed of a certain first semiconductor and a shell part formed of a second semiconductor. The QD may include at least one of II-VI group based semiconductor, III-V group based semiconductor, IV-VI group based semiconductor, and IV group based semiconductor. Since the QD has a significantly small size, a quantum confinement effect may be obtained. When particles are very small, electrons in the particle have a discontinuous energy state near an outer wall of the particle. In this case, as the size of a space in the particle decreases, the energy state of the electrons relatively increases and an energy band gap increases, which is referred to as the quantum confinement effect. According to the quantum confinement effect, when light such as an infrared ray or a visible ray is incident on QDs, light having a wavelength of various ranges may be generated. The wavelength of light generated from a QD may be determined based on the size, material, or structure of a QD particle. For example, when light of a wavelength having energy greater than the energy band gap is incident on a QD, the QD may absorb energy of the light and be excited, and may return to the ground state by emitting light of a specific wavelength. In this case, as the size of a QD or the core part of the QD decreases, light of a relatively short wavelength, for example, a blue-based light or a green-based light, may be generated. As the size of a QD or the core part of the QD increases, light of a relatively long wavelength, for example, a red-based light, may be generated. Accordingly, light of various colors may be embodied depending on the size of a QD or the core part of the QD. The emission wavelength may be adjusted not only by the size/diameter of a QD, but also by the constituent material and structure thereof. The first to third insulating layers N10, N20, and N30, in which the quantum dots QD1, QD2, and QD3 are embedded, may be dielectric layers made of, for example, a silicon oxide (SiO) or a silicon nitride (SiN). Each of the first to third QD-containing layers A10, A20, and A30 may have a thickness of, for example, about several tens of nanometers or less. Each of the first to fourth refractive index change layers R10, R20, R30, and R40 may have a thickness of, for example, about several tens of nanometers or less. However, the thicknesses of the first to third QD-containing layers A10, A20, and A30 and the first to fourth refractive index change layers R10, R20, R30, and R40 are not limited thereto and may vary.

According to an example embodiment, based on a change in the characteristics of the first to fourth refractive index change layers R10, R20, R30, and R40, the light-emission characteristics of the first to third QD-containing layers A10, A20, and A30 may be more quickly and easily modulated. In particular, the characteristics of the first to fourth refractive index change layers R10, R20, R30, and R40 may be more easily modulated based on a changed electrical signal, and consequently faster optical modulation may be possible. Furthermore, by using the first to third QD-containing layers A10, A20, and A30 having different central emission wavelengths, light of multiple wavelength regions, that is, multi-color, may be multiplexed, and may be more quickly modulated. Light beams of different wavelength regions may be independently controlled and modulated. When the first to third QD-containing layers A10, A20, and A30 all include the same quantum dots, as an optical modulating device is formed by inserting the first to third QD-containing layers A10, A20, and A30 between the first to fourth refractive index change layers R10, R20, R30, and R40, luminous efficiency and modulation efficiency may be improved.

Figure 2:
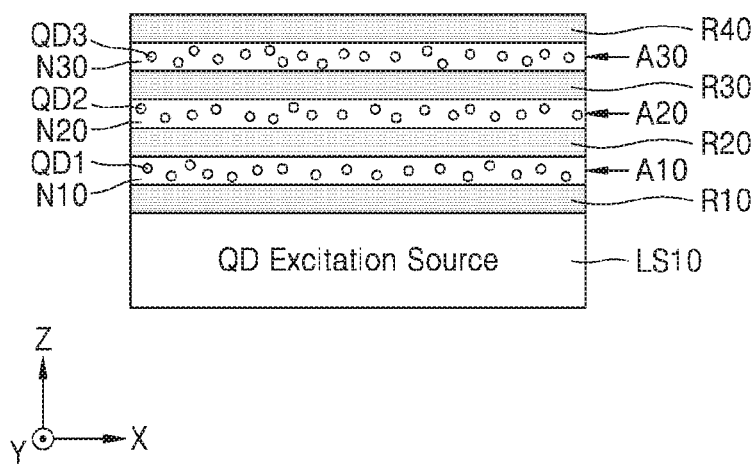
FIG. 2 is a cross-sectional view of an optical modulating device according to an example embodiment.

According to an example embodiment, the reflector RT10 and the band-stop mirror MR10 as illustrated in FIG. 1 may not be included, and an example thereof as illustrated in FIG. 2.

Referring to FIG. 2, an optical modulating device may include the first to third QD-containing layers A10, A20, and A30 and the first to fourth refractive index change layers R10, R20, R30, and R40 on the light source element LS10.

Figure 3:
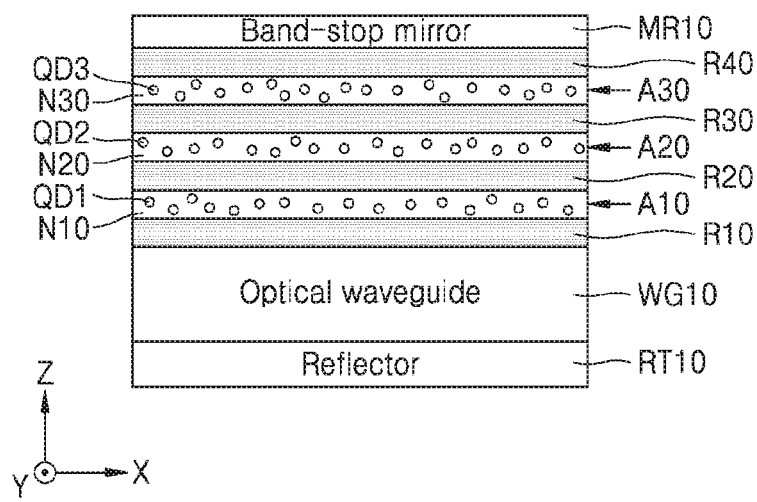
FIG. 3 is a cross-sectional view of an optical modulating device according to an example embodiment.
Figure 4:
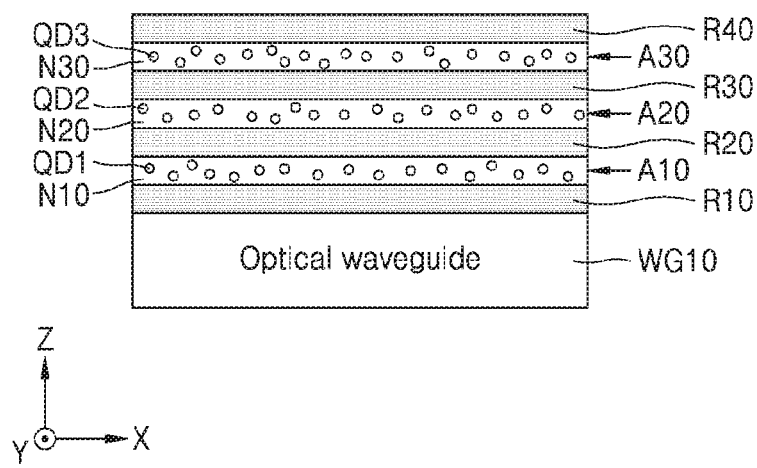
FIG. 4 is a cross-sectional view of an optical modulating device according to an example embodiment.

According to example embodiments, an optical waveguide WF10 may be provided at a position of the light source element LS10 in FIGS. 1 and 2, as illustrated in FIGS. 3 and 4.

FIGS. 3 and 4 respectively illustrate that an optical waveguide WG10 is provided at a position of the light source element LS10 of FIGS. 1 and 2. The optical waveguide WG10 may guide light to optically excite the first to third quantum dots QD1, QD2, and QD3. In this case, a separate light source element optically connected to the optical waveguide WG10 may be further provided.

Figure 5:
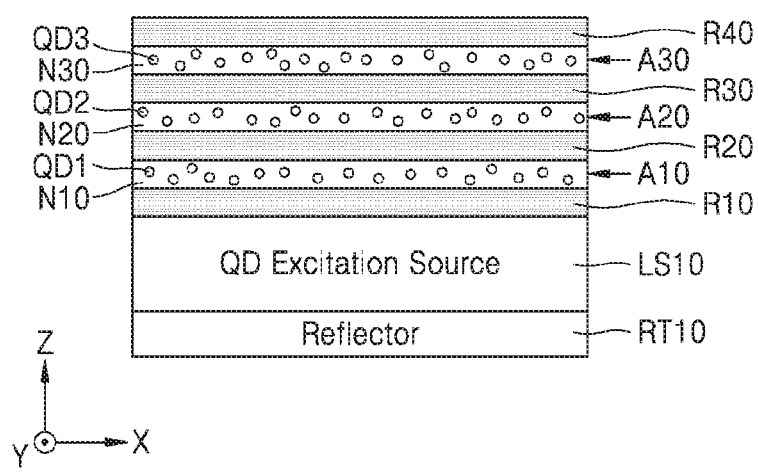
FIG. 5 is a cross-sectional view of an optical modulating device according to an example embodiment.

According to an example embodiment, the band-stop mirror MR10 as illustrated in FIGS. 1 and 3 may not be included, as illustrated in FIG. 5.

Figure 6:
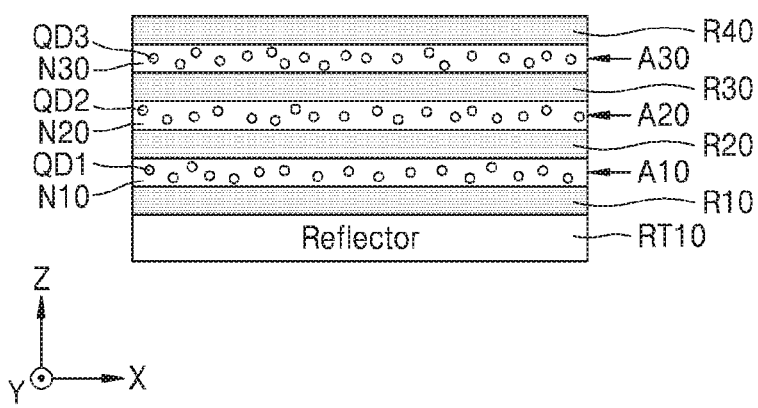
FIG. 6 is a cross-sectional view of an optical modulating device according to an example embodiment.

According to an example embodiment, in FIG. 5, the light source element L510 may not be included as illustrated in FIG. 6. In this case, the light to excite the first to third quantum dots QD1, QD2, and QD3 may be radiated from an external light source toward the first to third QD-containing layers A10, A20, and A30.

Figure 7:
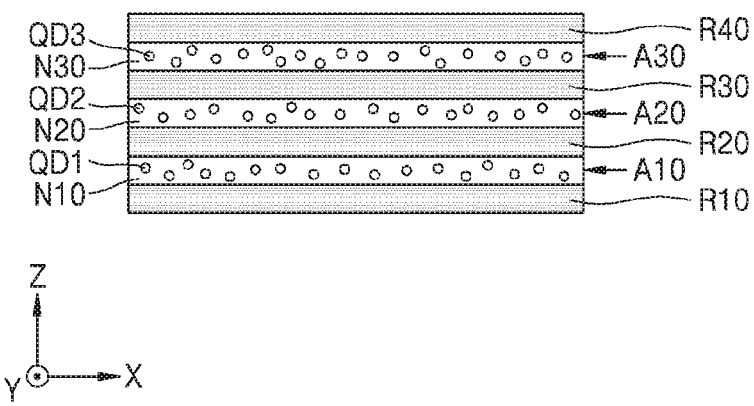
FIG. 7 is a cross-sectional view of an optical modulating device according to an example embodiment.

According to an example embodiment, in FIG. 6, the reflector RT10 may not be used, and an example thereof is illustrated in FIG. 7. In this case, the excitation light may be externally radiated toward the first to third QD-containing layers A10, A20, and A30.

Figure 8:
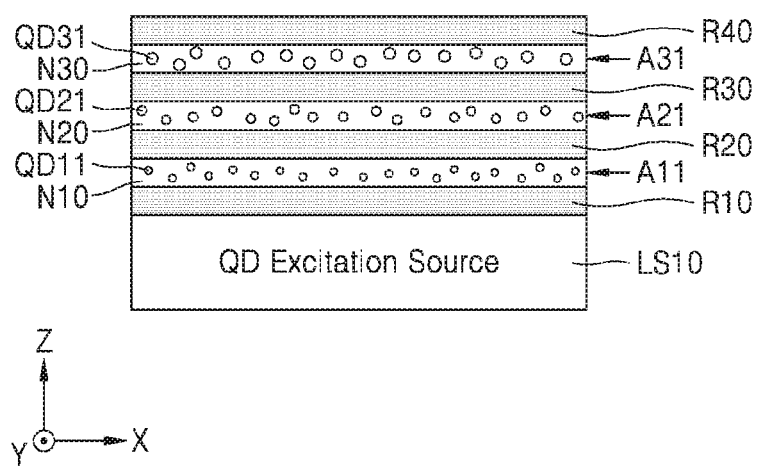
FIG. 8 is a cross-sectional view of an optical modulating device according to an example embodiment.

FIG. 8 is a cross-sectional view of an optical modulating device according to an example embodiment.

Referring to FIG. 8, at least two of a plurality of QD-containing layers, for example, first to third QD-containing layers A11, A21, and A31, may include QDs having different sizes. For example, first quantum dots QD11 of the first QD-containing layer A11, second quantum dots QD21 of the second QD-containing layer A21, and third quantum dots QD31 of the third QD-containing layer A31 may have different sizes.

Figure 9:
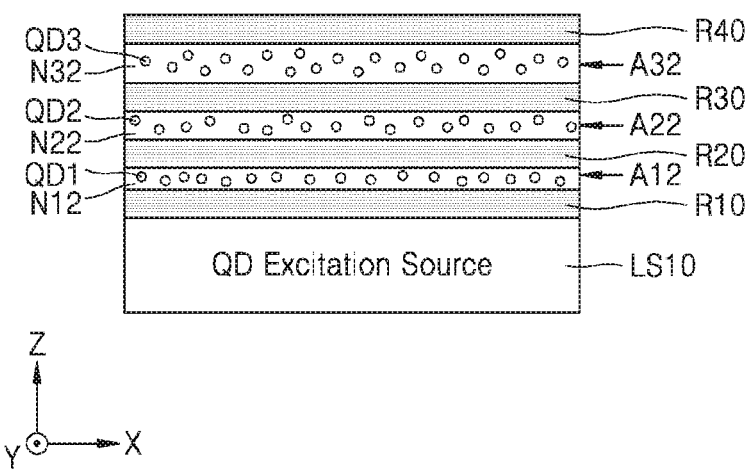
FIG. 9 is a cross-sectional view of an optical modulating device according to an example embodiment.

FIG. 9 is a cross-sectional view of an optical modulating device according to an example embodiment.

Referring to FIG. 9, at least two of a plurality of QD-containing layers, for example, first to third QD-containing layers A12, A22, and A32, may have different thicknesses. For example, a first insulating layer N12 of the first QD-containing layer A12, a second insulating layer N22 of the second QD-containing layer A22, and a third insulating layer N32 of the third QD-containing layer A32 may have different thicknesses. In this case, the amounts of first to third quantum dots QD1, QD2, and QD3 respectively included in the first to third QD-containing layers A12, A22, and A32 may be different from one another.

Figure 10:
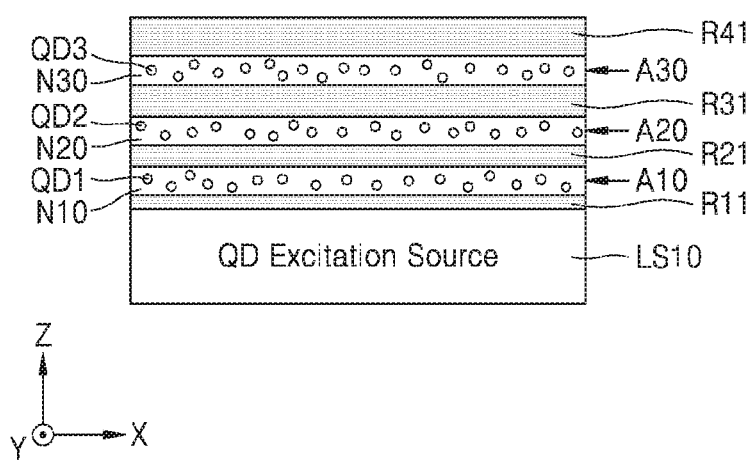
FIG. 10 is a cross-sectional view of an optical modulating device according to an example embodiment.

FIG. 10 is a cross-sectional view of an optical modulating device according to an example embodiment.

Referring to FIG. 10, at least two of a plurality of refractive index change layers, for example, first to fourth refractive index change layers R11, R21, R31, and R41, may have different thicknesses. For example, the first to fourth refractive index change layers R11, R21, R31, and R41 may have different thicknesses. However, the changes in the sizes of the QDs and the thicknesses of the layers described with reference to FIGS. 8 to 10 are exemplary, and may be variously changed.

Figure 11:
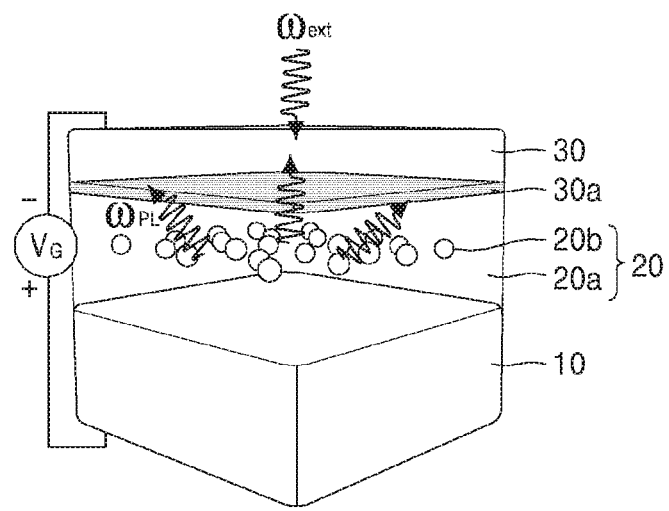
FIG. 11 is a perspective view illustrating the principle of optical modulation which is applicable to an optical modulating device according to an example embodiment.

FIG. 11 is a perspective view illustrating the principle of optical modulation which is applicable to an optical modulating device according to an example embodiment.

Referring to FIG. 11, a QD-containing layer 20 may be disposed between a conductive layer 10 and a refractive index change layer 30. The QD-containing layer 20 may include a plurality of QDs 20b provided in an insulating layer 20a. For example, the conductive layer 10 may include silver (Ag), and the refractive index change layer 30 may include TiN. The insulating layer 20a may include silicon dioxide ($SiO_2$), and the QDs 20b may include indium phosphide (InP). A signal application device $V_G$ may be connected between the conductive layer 10 and the refractive index change layer 30 to apply an electrical signal therebetween. A carrier density in a partial area, a carrier density change area 30a, of the refractive index change layer 30 may be changed according to the electric signal (voltage) applied by the signal application device $V_G$ between the conductive layer 10 and the refractive index change layer 30. The carrier density change area 30a may be located on a boundary surface between the refractive index change layer 30 and the QD-containing layer 20. A local density of states (LDOS) of the refractive index change layer 30 may be changed according to a change in the carrier density. Light $\omega_{PL}$ is generated from the QDs 20b that are excited by external light $\omega_{ext}$ by a photoluminescence (PL) effect. The light-emission characteristics of QDs may be controlled and tuned by LDOS modulation.

Figure 12:
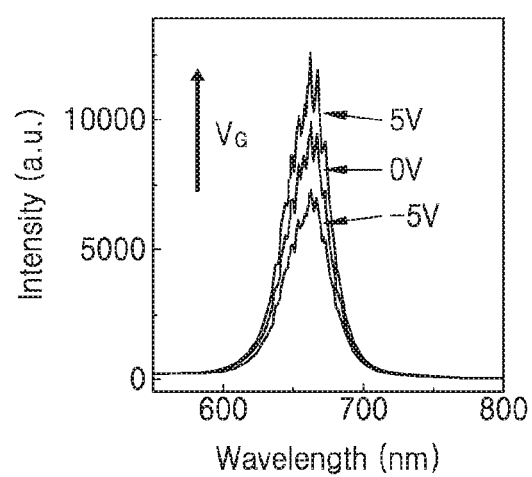
FIG. 12 is a graph showing a change in the intensity of photoluminescence (PL) according to a change in a voltage applied to the optical modulating device of FIG. 11.

FIG. 12 is a graph showing a change in the intensity of PL according to a change in a voltage $V_G$ applied to the optical modulating device of FIG. 11 according to an example embodiment. The graph of FIG. 12 illustrates that the intensity of PL changes according to the change in the voltage $V_G$.

Figure 13:
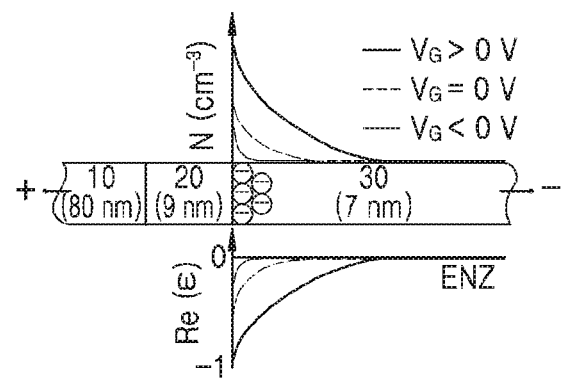
FIG. 13 is a graph showing a change in the physical properties of a refractive index change layer according to a change in the voltage applied to the optical modulating device of FIG. 11.

FIG. 13 is a graph showing a change in the physical properties of the refractive index change layer 30 according to a change in the voltage $V_G$ applied to the optical modulating device of FIG. 11 according to an example embodiment.

Referring to FIG. 13, it may be seen how carrier density N and permittivity Re of the refractive index change layer 30 are changed according to a change in the voltage $V_G$. In particular, the physical properties of a portion of the refractive index change layer 30 adjacent to the QD-containing layer 20 may change more rapidly according to a change in the voltage $V_G$. In the graph, ENZ denotes an epsilon near zero point.

Figure 14:
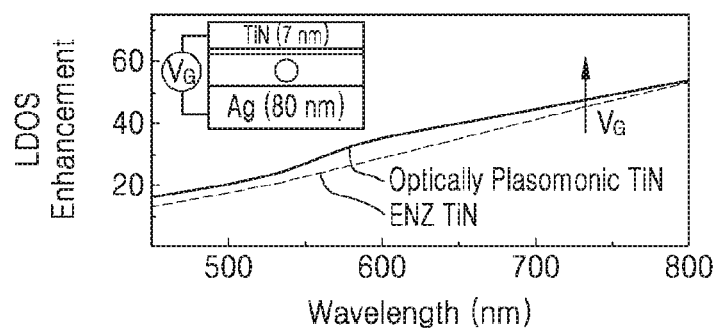
FIG. 14 is a graph showing a change in a local density of states (LDOS) enhancement spectrum at the position of quantum dot according to a change in the voltage according to an example embodiment.

FIG. 14 is a graph showing a change of a LDOS enhancement spectrum at the position of QD according to a change in the voltage $V_G$ according to an example embodiment. In the graph of FIG. 14, a dashed curve denotes that $V_G$ is less than 0 V, in which a refractive index change layer made of TiN is in an ENZ area. A solid curve denotes that $V_G$ is greater than 0 V, in which the refractive index change layer made of TiN includes an optically plasmonic TiN area. It may be seen from the graph that an LDOS enhancement effect occurs according to a change in the voltage $V_G$.

Figure 15:
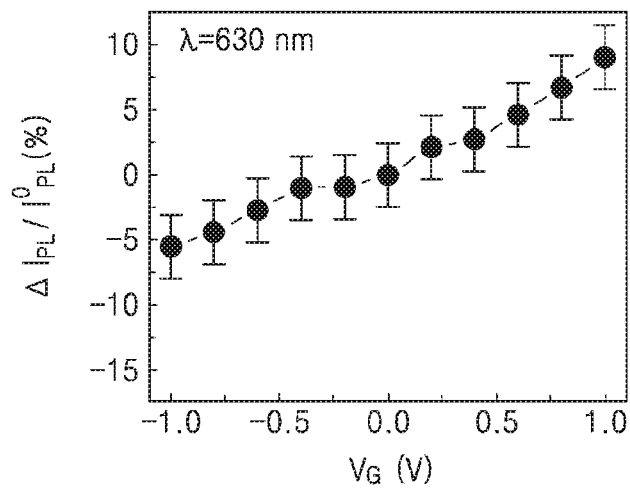
FIG. 15 is a graph showing the amount of changes in the intensity of PL of quantum dots according to a change in the voltage according to an example embodiment.

FIG. 15 is a graph showing a result of the measurement of the amount of changes in the intensity of PL of QDs according to a change in the voltage $V_G$ according to an example embodiment. The result is obtained from the optical modulating device of FIG. 11. In the graph of FIG. 15, $I^0_{PL}$ denotes the intensity of PL at 0 V, and $\Delta I_{PL}$ denotes a difference between the intensity of PL at a certain voltage other than 0 V and the intensity of PL at 0 V. It may be seen from the result of FIG. 15 that the amount of changes in the intensity of PL, that is, $\Delta I_{PL}/I^0_{PL}$ (%), is changed according to a change in the voltage $V_G$.

Figure 16:
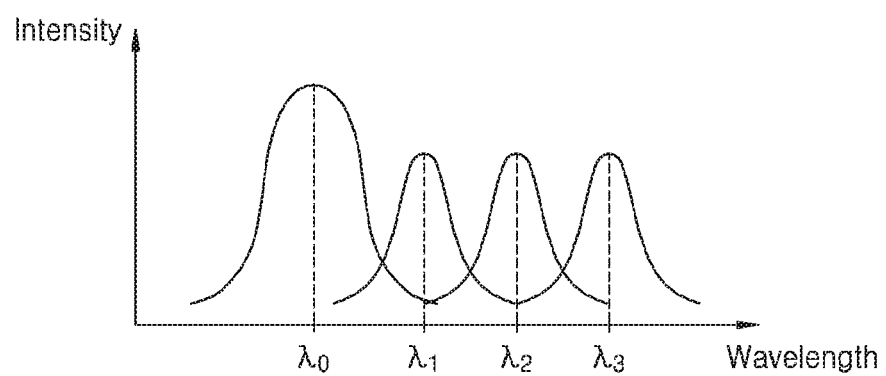
FIG. 16 is a graph showing an example of a central emission wavelength of a plurality of quantum dots and an emission wavelength of a light source element that is applicable to an optical modulating device according to an example embodiment.

FIG. 16 is a graph showing an example of a central emission wavelength of a plurality of QDs and an emission wavelength of a light source element that is applicable to an optical modulating device according to an example embodiment.

Referring to FIG. 16, first QDs may have a first central emission wavelength $\lambda_1$, second QDs may have a second central emission wavelength $\lambda_2$, and third QDs may have a third central emission wavelength $\lambda_3$. The first to third central emission wavelengths $\lambda_1$, $\lambda_2$, and $\lambda_3$ may be different from each other. The first to third QDs may respectively correspond to, for example, the first to third quantum dots QD1, QD2, and QD3 of example embodiments such as an example illustrated in FIG. 1. An emission wavelength $\lambda_0$ of a light source element may be less than the first to third central emission wavelengths $\lambda_1$, $\lambda2$, and $\lambda3$. As the emission wavelength $\lambda_0$ of a light source element is relatively short, the light-emission energy of a light source element may be relatively high.

Figure 17:
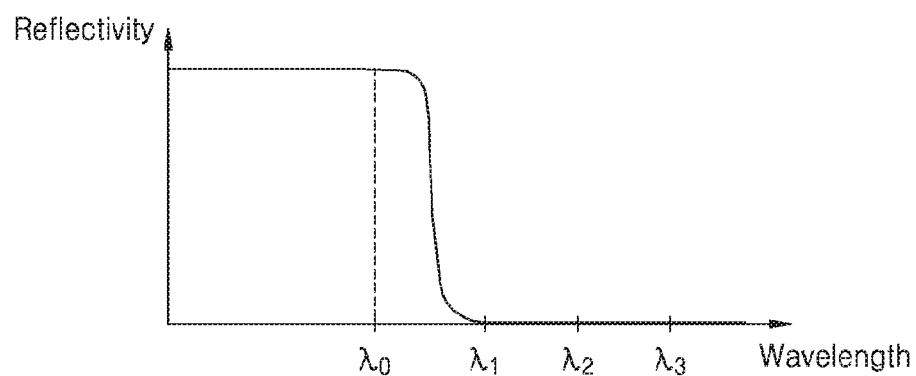
FIG. 17 is a graph showing an example of the reflection characteristics of a band-stop mirror that is applicable to an optical modulating device according to an example embodiment.

FIG. 17 is a graph showing an example of the reflection characteristics of a band-stop mirror that is applicable to an optical modulating device according to an example embodiment.

Referring to FIG. 17, a band-stop mirror may have high reflectivity to the emission wavelength $\lambda_0$ of a light source element and a wavelength less than or equal to the emission wavelength $\lambda_0$, and may have lower reflectivity, that is, higher transmissivity, to the emission wavelengths $\lambda_1$, $\lambda_2$, and $\lambda_3$ of the QDs. The band-stop mirror may correspond to, for example, the band-stop mirror MR10 of FIG. 1.

Figure 18:
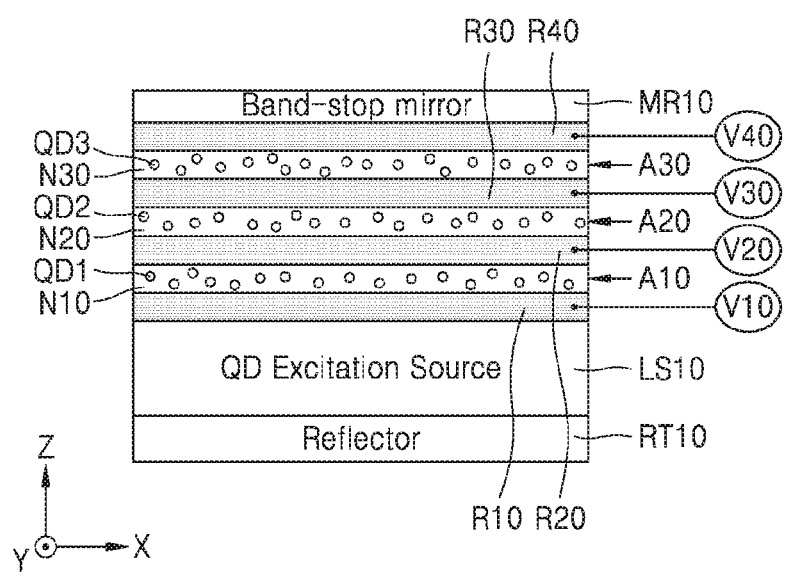
FIG. 18 is a cross-sectional view illustrating an example in which a signal application device is connected to an optical modulating device according to an example embodiment.

FIG. 18 is a cross-sectional view illustrating an example in which a signal application device is connected to an optical modulating device according to an example embodiment.

Referring to FIG. 18, a signal application device for applying an electrical signal to the first to fourth refractive index change layers R10, R20, R30, and R40 may be connected to the optical modulating device. For example, the signal application device may include a first voltage application device V10 for applying a voltage to the first refractive index change layer R10, the second voltage application device V20 for applying a voltage to the second refractive index change layer R20, the third voltage application device V30 for applying a voltage to the third refractive index change layer R30, and the fourth voltage application device V40 for applying a voltage to the fourth refractive index change layer R40. An electrical signal (voltage) may be independently applied to each of the first to fourth refractive index change layers R10, R20, R30, and R40. The refractive indexes of the first to fourth refractive index change layers R10, R20, R30, and R40 may be changed based on the voltages applied by the signal application device.

Figure 19:
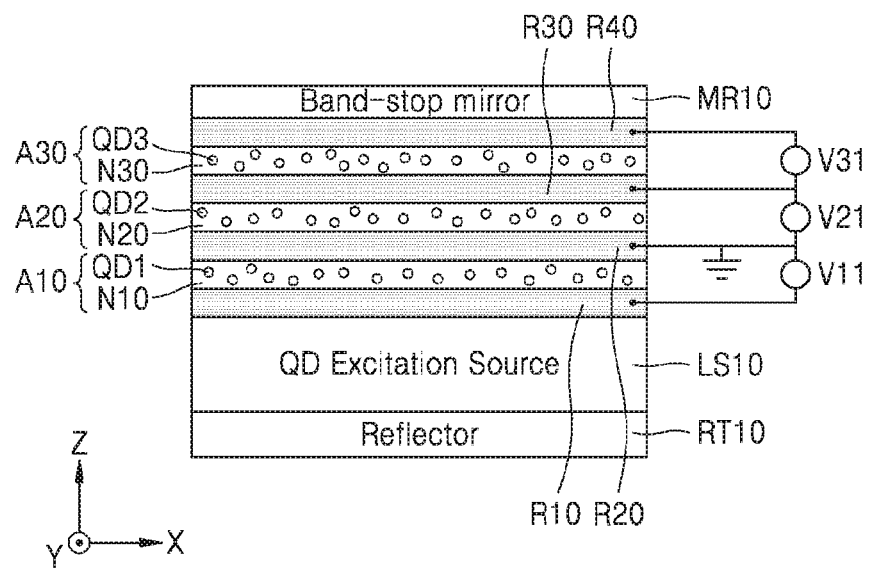
FIG. 19 is a cross-sectional view illustrating an example in which a signal application device is connected to an optical modulating device according to an example embodiment.

FIG. 19 is a cross-sectional view illustrating an example in which a signal application device is connected to an optical modulating device according to an example embodiment.

Referring to FIG. 19, the signal application device may include a first voltage application device V11 for applying a voltage between the first refractive index change layer R10 and the second refractive index change layer R20, a second voltage application device V21 for applying a voltage between the second refractive index change layer R20 and the third refractive index change layer R30, and a third voltage application device V31 for applying a voltage between the third refractive index change layer R30 and the fourth refractive index change layer R40. In this case, one of the first to fourth refractive index change layers R10, R20, R30, and R40 may be grounded. FIG. 19 illustrates that the second refractive index change layer R20 is illustrated to be grounded, however this is exemplary and none of the first to fourth refractive index change layers R10, R20, R30, and R40 may be grounded or a different refractive index change layer may be grounded.

Although FIGS. 18 and 19 illustrate examples in which the signal application device for applying an electrical signal to the first to fourth refractive index change layers R10, R20, R30, and R40 is connected thereto, example embodiments are not limited thereto and the connection method of the signal application device may vary.

The optical modulating device according to an example embodiment may further include a non-antenna structure that is configured to control the output characteristics of light emitted from the QD-containing layers and provided on one surface of a stack structure including a plurality of QD-containing layers and a plurality of refractive index change layers. The nano-antenna structure may include an output coupler, and may further include an input coupler. The nano-antenna structure is described in detail with reference to FIGS. 20 to 31.

Figure 20:
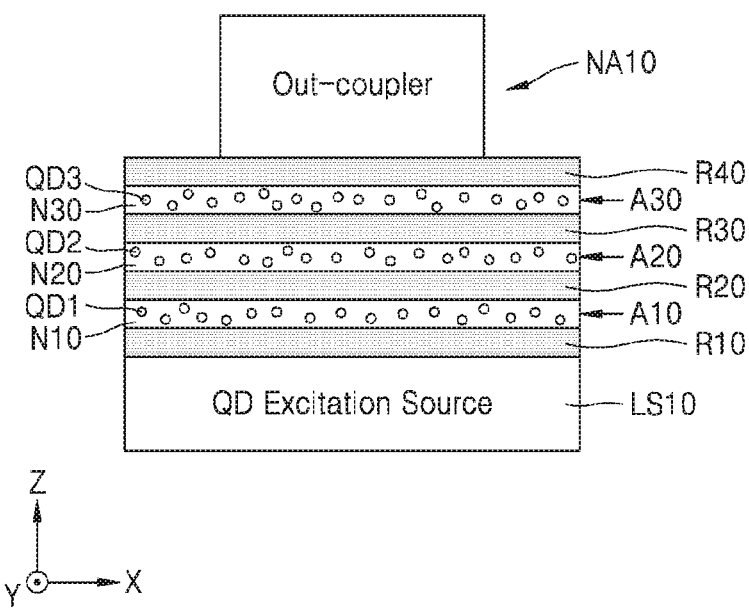
FIG. 20 is a cross-sectional view of an optical modulating device according to an example embodiment.

FIG. 20 is a cross-sectional view of an optical modulating device according to an example embodiment.

Referring to FIG. 20, a stack structure of the first to fourth refractive index change layers R10, R20, R30, and R40 and the first to third QD-containing layers A10, A20, and A30 may be provided on the light source element LS10, and a nano-antenna structure NA10 may be provided on the stack structure opposite to the light source element LS10. The nano-antenna structure NA10 may be an output coupler that improves the output characteristics of light emitted from the first to third QD-containing layers A10, A20, and A30. The nano-antenna structure NA10 may have a configuration coupled to an emission wavelength of at least one of the first to third QD-containing layers A10, A20, and A30. For example, a resonance wavelength region of the nano-antenna structure NA10 may be at least partially overlapped with an emission wavelength region of the first to third QD-containing layers A10, A20, and A30. The light-emission/output characteristics in the first to third QD-containing layers A10, A20, and A30 may be improved by the nano-antenna structure NA10, and the directivity and directionality of output light may be improved. Accordingly, far-field emission characteristics may be embodied by using the nano-antenna structure NA10.

The nano-antenna structure NA10 may include any one of various structures such as a metallic antenna, a dielectric antenna, or a slit-containing structure, for example, a structure in which a slit is formed in a metal layer. The output characteristics of light may vary according to the size, shape, or material of the nano-antenna structure NA10. Furthermore, the nano-antenna structure NA10 may include a refractive index change material or a phase change material. In this case, the output characteristics of light may be controlled by using the nano-antenna structure NA10, that is, a refractive index change or phase change of the output coupler.

Figure 21:
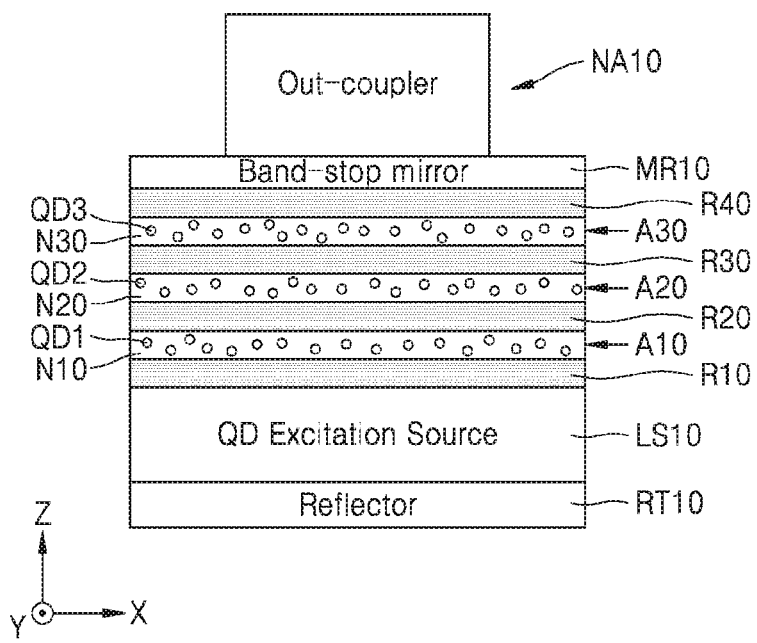
FIG. 21 is a cross-sectional view of an optical modulating device according to an example embodiment.

FIG. 21 is a cross-sectional view of an optical modulating device according to an example embodiment. The example embodiment shows an example in which the nano-antenna structure NA10 is applied to the optical modulating device of FIG. 1. The nano-antenna structure NA10 may be applied to a variety of the optical modulating devices described with reference to FIGS. 1 to 10 and FIGS. 18 and 19.

Figure 22:
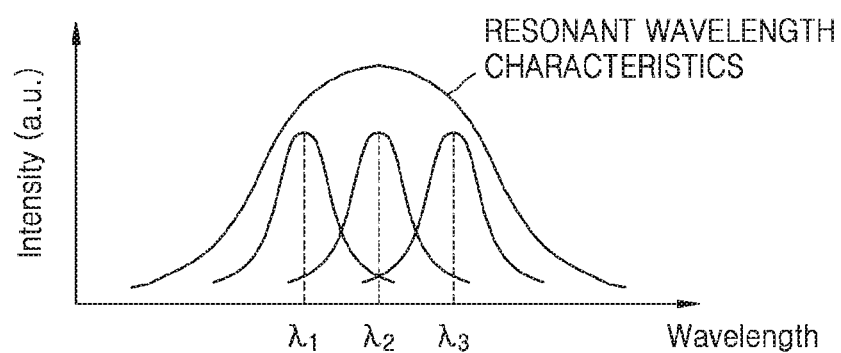
FIG. 22 is a graph showing a relationship between the central emission wavelength of a plurality of quantum dots and a resonance wavelength region of an output coupler which is applicable to an optical modulating device according to an example embodiment.

FIG. 22 is a graph showing a relationship between the central emission wavelength of a plurality of QDs and a resonance wavelength region of an output coupler which is applicable to an optical modulating device according to example embodiments.

Referring to FIG. 22, the resonance wavelength region of an output coupler may cover regions of the central emission wavelengths $\lambda_1$, $\lambda_2$, and $\lambda_3$ of a plurality of QDs. Accordingly, the light-emission coupling characteristics in a plurality of QDs may be improved by the output coupler.

Figure 23:
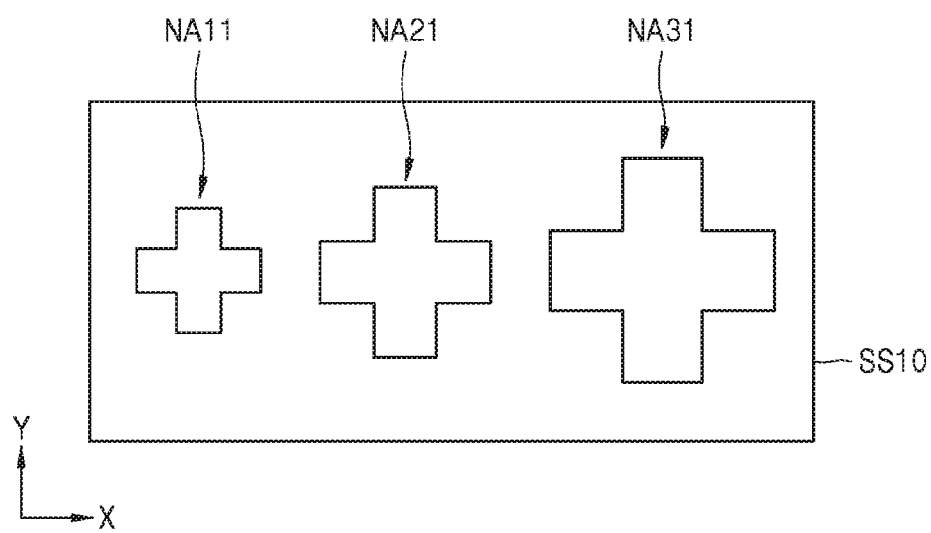
FIG. 23 is a plan view illustrating a nano-antenna structure which is applicable to an optical modulating device according to an example embodiment.

FIG. 23 is a plan view illustrating a nano-antenna structure which is applicable to an optical modulating device according to an example embodiment.

Referring to FIG. 23, a stack structure SS10 of a plurality of refractive index change layers and a plurality of QD-containing layers may include a plurality of nano-antennas. The nano-antennas may include, for example, a first nano-antenna NA11, a second nano-antenna NA21, and a third nano-antenna NA31. At least two of the first, second, and third nano-antennas NA11, NA21, and NA31 may have different sizes, may include different materials, or may have different shapes. In the an example embodiment, the first, second, and third nano-antennas NA11, NA21, and NA31 are illustrated having different sizes. The first nano-antenna NA11 may have a first resonance wavelength region corresponding to the emission wavelength of the first quantum dots QD1, the second nano-antenna NA21 may have a second resonance wavelength region corresponding to the emission wavelength of the second quantum dots QD2, and the third nano-antenna NA31 may have a third resonance wavelength region corresponding to the emission wavelength of the third quantum dots QD3. In this case, light of different wavelengths may be output from the first, second, and third nano-antennas NA11, NA21, and NA31. However, example embodiments are not limited thereto.

Figure 24:
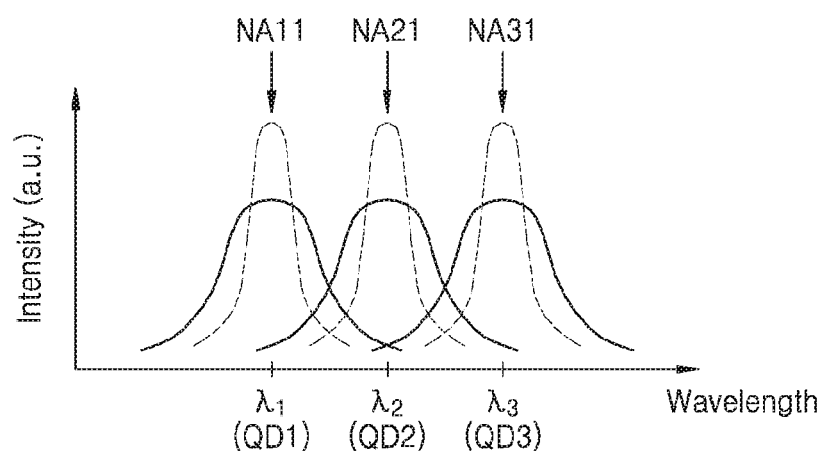
FIG. 24 is a graph showing a relationship between the central emission wavelength of a plurality of quantum dots and the resonance wavelength region of a plurality of output couplers (nano-antennas), which is applicable to an optical modulating device according to an example embodiment.

FIG. 24 is a graph showing a relationship between the central emission wavelength of a plurality of quantum dots and the resonance wavelength region of a plurality of output couplers (nano-antennas) which are applicable to an optical modulating device according to an example embodiment.

Referring to FIG. 24, a resonance wavelength region of the first output coupler NA11 may correspond to the central emission wavelength $\lambda_1$ of the first quantum dots QD1, a resonance wavelength region of the second output coupler NA21 may correspond to the central emission wavelength $\lambda_2$ of the second quantum dots QD2, and a resonance wavelength region of the third output coupler NA31 may correspond to the central emission wavelength $\lambda_3$ of the third quantum dots QD3. Accordingly, the light-emission coupling characteristics in each of the QDs may be improved by each output coupler.

Figure 25:
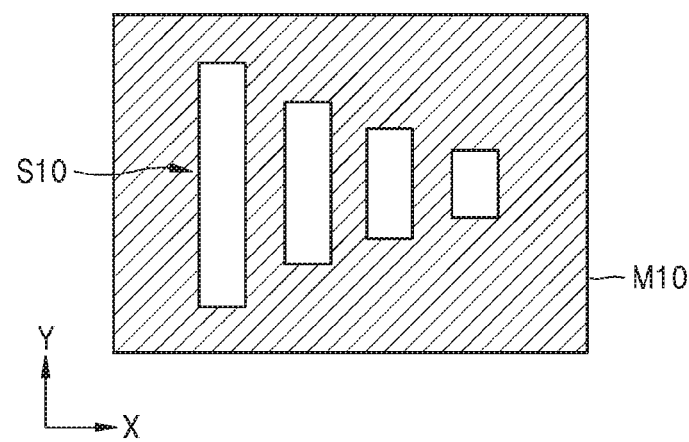
FIG. 25 is a plan view for explaining a nano-antenna structure which is applicable to an optical modulating device according to an example embodiment.

FIG. 25 is a plan view illustrating a nano-antenna structure which is applicable to an optical modulating device according to an example embodiment. In the example embodiment, a nano-antenna structure includes a slit.

Referring to FIG. 25, a certain slit may be formed in a material layer M10. For example, a plurality of slits S10 may be arranged forming an array. The characteristics and direction of output light may be controlled according to the size and arrangement manner of the slits S10. However, the arrangement manner of the slit S10 proposed herein is merely exemplary and may be changed in various ways. The material layer M10 may be a metal layer.

A nano-antenna structure according to an example embodiment may further include an output coupler and an input coupler apart from the output coupler. For example, a nano-antenna structure may include a multi-patch antenna structure or a fishbone antenna structure, which is described with reference to FIGS. 26 to 31.

Figure 26:
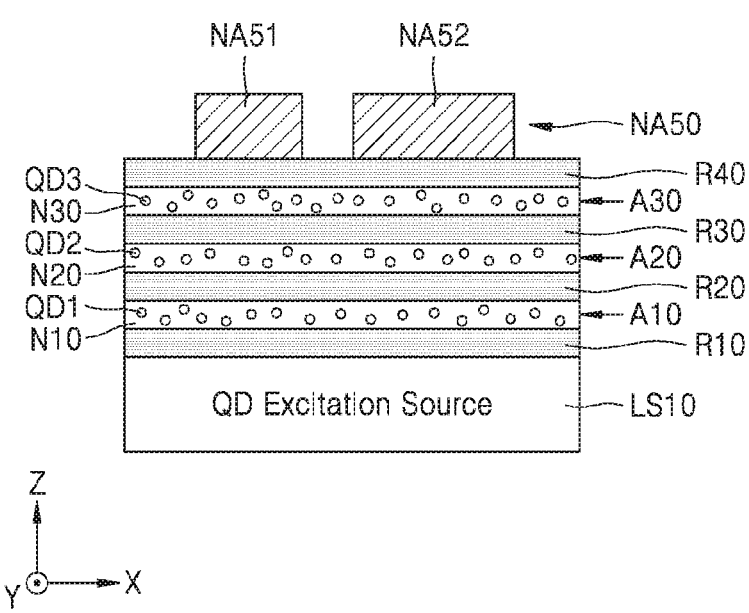
FIG. 26 is a cross-sectional view of an optical modulating device according to an example embodiment.
Figure 27:
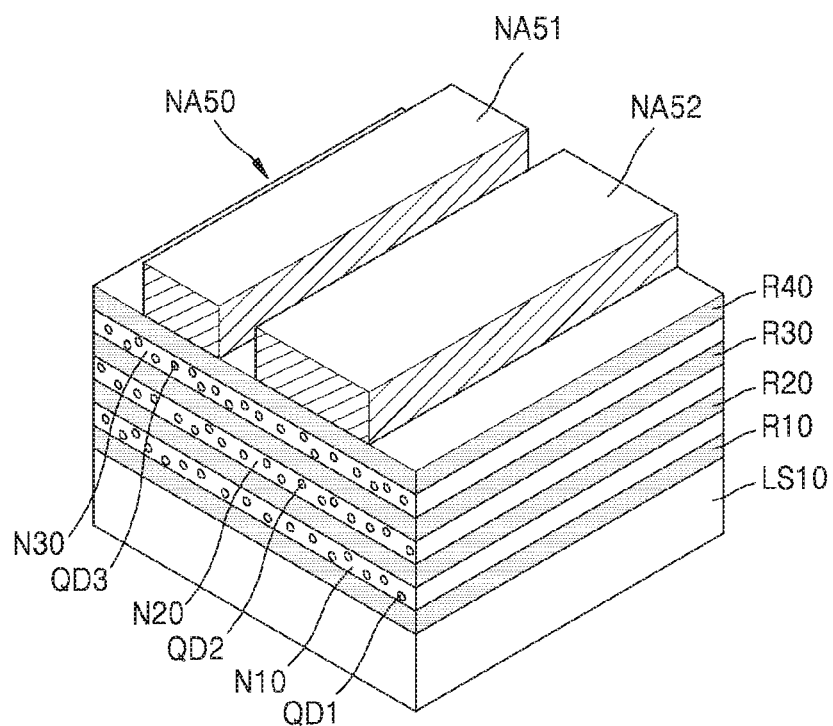
FIG. 27 is a perspective view of FIG. 26.

FIG. 26 is a cross-sectional view of an optical modulating device according to an example embodiment. FIG. 27 is a perspective view of FIG. 26.

Referring to FIGS. 26 and 27, a nano-antenna structure NA50 having a dual patch structure may be provided on the stack structure of the first to fourth refractive index change layers R10, R20, R30, and R40 and the first to third QD-containing layers A10, A20, and A30. The nano-antenna structure NA50 may include an input coupler NA51 corresponding to a first patch and an output coupler NA52 corresponding to a second patch. A resonance wavelength region of the input coupler NA51 may be at least partially overlapped with excitation wavelength regions of the quantum dots QD1, QD2, and QD3. When the light source element LS10 is used, excitation light generated from the light source element LS10 may be used, and excitation light coming from the outside may be further used altogether. The input coupler NA51 may improve input efficiency (input coupling efficiency) with respect to the excitation light (incident light) coming from the outside. The resonance wavelength region of the output coupler NA52 may be at least partially overlapped with the emission wavelength regions of the quantum dots QD1, QD2, and QD3. Accordingly, the light output characteristics (output coupling characteristics) in the first to third QD-containing layers A10, A20, and A30 may be improved by the output coupler NA52. The width of the output coupler NA52 may be greater than the width of the input coupler NA51. A central resonance wavelength may vary according to the width of the coupler NA51 or NA52.

Figure 28:
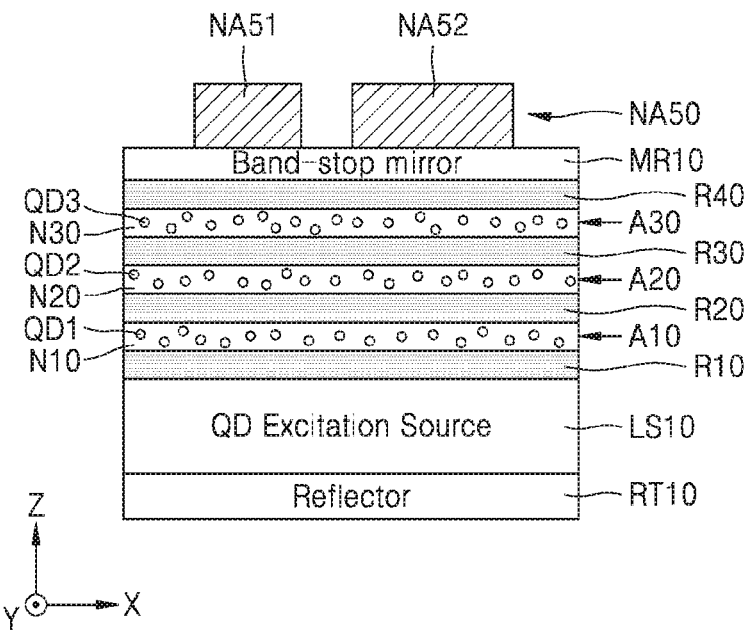
FIG. 28 is a cross-sectional view of an optical modulating device according to an example embodiment.

FIG. 28 is a cross-sectional view of an optical modulating device according to an example embodiment. The example embodiment shows an example in which the nano-antenna structure NA50 is applied to the optical modulating device of FIG. 1. The nano-antenna structure NA50 may be applied to various optical modulating devices described with reference to FIGS. 1 to 10 and FIGS. 18 and 19.

Although FIGS. 26 to 28 illustrate a case of using the nano-antenna having a dual patch structure, a nano-antenna having a multi-patch structure having three or more patches may be used. An example thereof is illustrated in FIG. 29.

Figure 29:
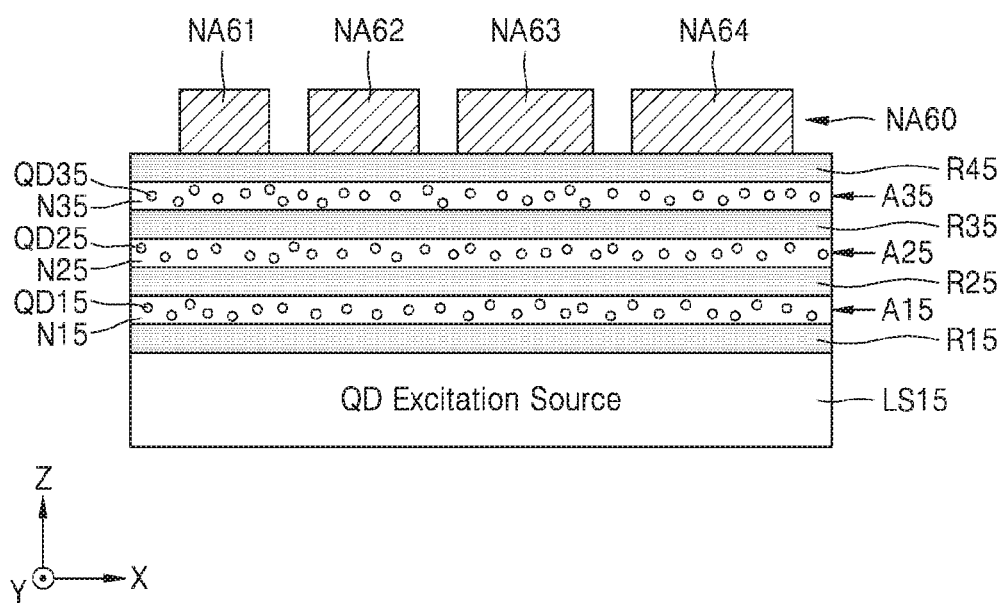
FIG. 29 is a cross-sectional view of an optical modulating device according to an example embodiment.

FIG. 29 is a cross-sectional view of an optical modulating device according to an example embodiment.

Referring to FIG. 29, a nano-antenna structure NA60 having a multi-patch structure may be provided on a stack structure of a plurality of refractive index change layers R15, R25, R35, and R45 and a plurality of QD-containing layers A15, A25, and A35. For example, the nano-antenna structure NA60 may include at least one input coupler NA61 and a plurality of output couplers, such as, first to third output couplers NA62, NA63, and NA64. The first to third output couplers NA62, NA63, and NA64 may be designed to be optically coupled to different emission wavelength regions. In this regard, the first to third output couplers NA62, NA63, and NA64 may have different sizes, include different materials, and have different shapes. The first output coupler NA62 may correspond to an emission wavelength region of first quantum dots QD15, the second output coupler NA63 may correspond to an emission wavelength region of second quantum dots QD25, and the third output coupler NA64 may correspond to an emission wavelength region of third quantum dots QD35. Accordingly, the nano-antenna structure NA60 may be designed such that light beams emitted from the QD-containing layers A15, A25, and A35 are output through different output couplers from the first to third output couplers NA62, NA63, and NA64. The shape, size, or arrangement order of the input coupler NA61 and the first, second, and third output couplers NA62, NA63, and NA64 illustrated in FIG. 29 are merely exemplary and may vary.

Figure 30:
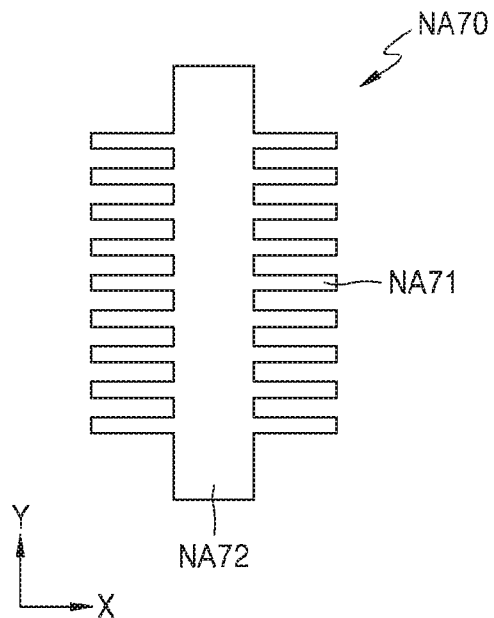
FIG. 30 illustrates a nano-antenna having a fishbone structure which is applicable to an optical modulating device according to an example embodiment.
Figure 31:
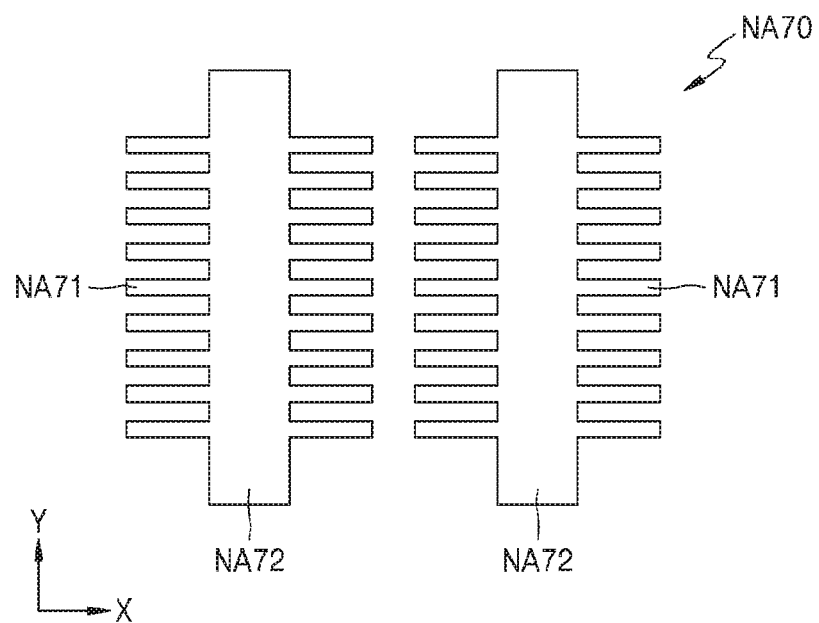
FIG. 31 illustrates a nano-antenna having a plurality of fishbone structures which is applicable to an optical modulating device according to an example embodiment.

FIGS. 30 and 31 are plan views illustrating a nano-antenna having a fishbone structure which is applicable to an optical modulating device according to an example embodiment.

FIG. 30 illustrates a nano-antenna having a fishbone structure which is applicable to an optical modulating device according to an example embodiment.

Referring to FIG. 30, a nano-antenna structure NA70 may include a first nano-antenna element NA71 extending in a first direction and a second nano-antenna element NA72 extending in a second direction perpendicular to the first direction. In the example embodiment, the first nano-antenna element NA71 may include a plurality of first nano-antenna elements NA71 intersecting the second nano-antenna element NA72. Accordingly, the nano-antenna structure NA70 may have a fishbone structure.

The first nano-antenna element NA71 may be an input coupler, and the second nano-antenna element NA72 may be an output coupler. In this case, incident light may have a first polarized direction by the first nano-antenna element NA71, and output light may have a second polarized direction perpendicular to the first polarized direction by the second nano-antenna element NA72. Accordingly, when the nano-antenna NA70 having a fishbone structure is used, the polarized directions of the incident light and the output light may be controlled.

FIG. 31 illustrates a nano-antenna having a fishbone structure which is applicable to an optical modulating device according to an example embodiment.

Referring to FIG. 31, the nano-antenna structure NA70 may include a plurality of nano-antenna structures NA70 which are arranged according to a certain rule. In the example embodiment, only two nano-antenna structures NA70 are illustrated as an example. While the two nano-antenna structures NA70 may be substantially the same, in some cases, the size, pattern size, or pattern interval thereof may vary. Furthermore, the nano-antenna structures NA70 may be arranged apart from one another, or the first nano-antenna elements NA71 of the nano-antenna structures NA70 may be connected to each other. The nano-antennas having a fishbone structure described with reference to FIGS. 30 and 31 are exemplary and may be variously changed.

The nano-antenna may be an antenna having a nano structure with respect to light, which may convert incident light including all visible and invisible electromagnetic waves of a specific wavelength or frequency to a shape of a localized surface plasmon resonance, and capture energy thereof. The nano-antenna may include a conductive layer pattern, for example, a metal layer pattern, and the conductive layer pattern may be in contact with a non-conductive layer, for example, a dielectric layer. Plasmon resonance may be generated at an interface between the conductive layer pattern and the non-conductive layer, for example, a dielectric layer. An interface where surface plasmon resonance is generated, such as, the interface between the conductive layer pattern and the non-conductive layer, for example, a dielectric layer, may collectively form a meta surface or a meta structure. The nano-antenna may be formed of a conductive material and may have a dimension of a sub-wavelength which is a dimension less than the operation wavelength of the nano-antenna. At least any one of dimensions forming a shape of the nano-antenna, for example, a thickness, a horizontal length, a vertical length, or an interval between nano-antennas, may have the dimension of a sub-wavelength.

The nano-antenna may have a variety of structures/shapes such as a rectangular pattern, a line pattern, a circular disc, an oval disc, a cross, or an asterisk. A cross type may have a shape in which two nanorods intersect perpendicular to each other. An asterisk type may have a star shape in which three nanorods intersect with one another. In addition, the nano-antenna may have a variety of modified structures such as a cone, a triangular pyramid, a sphere, a hemisphere, a rice grain, or a rod. Furthermore, the nano-antenna may have a multilayer structure in which a plurality of layers are stacked, or a core-shell structure including a core part and at least one shell part. Additionally, two or more nano-antennas having different structures/shapes forming one unit may be periodically arranged.

A resonance wavelength, a resonant wavelength width, resonant polarization characteristics, a resonance angle, reflection/absorption/transmission characteristics may be changed depending on the structure/shape and arrangement method of the nano-antenna. Accordingly, by controlling the structure/shape and arrangement method of the nano-antenna, an optical modulating device having characteristics suitable for a certain purpose may be manufactured.

The optical modulating devices according to example embodiments may be applied to a variety of optical apparatuses such as a thin display, an ultrathin display, an on-chip emitter for an integrated optical circuit, a light fidelity (Li-Fi) field corresponding to a next generation wireless fidelity (Wi-Fi), or a light detection and ranging (LiDAR) apparatus. Furthermore, the optical modulating device according to example embodiments may be applied to a holographic display apparatus and a structured light generation apparatus. Furthermore, the optical modulating device may be applied to a variety of optical element/apparatus such as a hologram generation apparatus or an optical coupling device. Furthermore, the optical modulating device may be applied to a variety of fields in which a meta surface or a meta structure is used. In addition, the optical modulating device according to example embodiments and the optical apparatus including the same may be applied to a variety of optical and electronic apparatus fields for various purposes.

Additionally, although, in example embodiments, application of an electrical signal, a voltage, is described for modulating a refractive index of the refractive index change layer. However, example embodiments are not limited thereto, and there may be a variety of methods of modulating the refractive index of the refractive index change layer. For example, a modulating method of the refractive index of the refractive index change layer may include electric field application, magnetic field application, heating and cooling, optical pumping, or microscale or nanoscale electro-mechanical deformation and modulation. Furthermore, a material and a configuration/structure of the refractive index change layer may be changed in various ways.

It should be understood that example embodiments described herein should be considered in a descriptive sense only and not for purposes of limitation. Descriptions of features or aspects within each embodiment should typically be considered as available for other similar features or aspects in other embodiments. For example, one of ordinary skill in the art to which the present disclosure pertains would understand that the structure of the optical modulating device described with reference to FIGS. 1 to 10 and FIGS. 18 to 31 may be changed in various ways.

While one or more example embodiments have been described with reference to the drawings, it will be understood by those of ordinary skill in the art that various changes may be made therein without departing from the spirit and scope of the present disclosure as defined by the following claims.

What is claimed is:

1. An optical modulating device comprising:
 a plurality of refractive index change layers; and
 a plurality of quantum dot (QD)-containing layers disposed between the plurality of refractive index change layers, respectively,
 wherein the optical modulating device is configured to modulate light-emission characteristics of the plurality of QD-containing layers, and
 wherein each of the plurality of QD-containing layers comprises an insulating layer and a plurality of quantum dots embedded in the insulating layer.

2. The optical modulating device of claim 1, wherein at least two of the plurality of QD-containing layers have central emission wavelengths that are different from each other.

3. The optical modulating device of claim 1, wherein the plurality of QD-containing layers comprise a first QD-containing layer and a second QD-containing layer, the first QD-containing layer comprising first quantum dots and the second QD-containing layer comprising second quantum dots, and
 the first quantum dots and the second quantum dots comprise materials that are different from each other and/or have sizes that are different from each other.

4. The optical modulating device of claim 1, wherein at least two of the plurality of QD-containing layers have thicknesses that are different from each other.

5. The optical modulating device of claim 1, wherein at least two of the plurality of refractive index change layers comprise materials that are different from each other.

6. The optical modulating device of claim 1, wherein at least two of the plurality of refractive index change layers have carrier densities that are different from each other.

7. The optical modulating device of claim 1, wherein at least two of the plurality of refractive index change layers have thicknesses that are different from each other.

8. The optical modulating device of claim 1, wherein the plurality of refractive index change layers comprise at least one of a transparent conductive oxide and a transition metal nitride.

9. The optical modulating device of claim 1, further comprising a signal application device configured to apply an electrical signal to the plurality of refractive index change layers,
the optical modulating device being configured to change refractive indexes of the plurality of refractive index change layers based on the electrical signal applied by the signal application device.

10. The optical modulating device of claim 1, wherein the plurality of refractive index change layers and the plurality of QD-containing layers form a stack structure, and
wherein the optical modulating device further comprises:
a reflector provided on a first surface of the stack structure; and
a band-stop mirror provided on a second surface, opposite to the first surface, of the stack structure.

11. The optical modulating device of claim 10 further comprising a light source provided between the stack structure and the reflector and configured to emit light to optically excite quantum dots included in the plurality of QD-containing layers, or an optical waveguide disposed between the stack structure and the reflector and configured to guide light to optically excite the quantum dots included in the plurality of QD-containing layers.

12. The optical modulating device of claim 1, wherein the plurality of refractive index change layers and the plurality of QD-containing layers form a stack structure,
the optical modulating device further comprising a light source provided on a surface of the stack structure and configured to emit light to optically excite quantum dots included in the plurality of QD-containing layers, or an optical waveguide provided on the surface of the stack structure and configured to guide light to optically excite the quantum dots included in the plurality of QD-containing layers.

13. The optical modulating device of claim 1,
wherein the plurality of refractive index change layers and the plurality of QD-containing layers form a stack structure,
the optical modulating device further comprising a nano-antenna structure provided on a first surface of the stack structure.

14. The optical modulating device of claim 13, wherein the nano-antenna structure comprises one of a metallic antenna, a dielectric antenna, and a slit-containing structure.

15. The optical modulating device of claim 13, wherein the nano-antenna structure comprises one of a multi-patch antenna structure and a fishbone shaped antenna structure.

16. The optical modulating device of claim 13, wherein the nano-antenna structure comprises an output coupler.

17. The optical modulating device of claim 13 further comprising a light source provided at a second surface, opposite to the first surface, of the stack structure and configured to emit light to optically excite quantum dots included in the plurality of QD-containing layers, or an optical waveguide provided at the second surface of the stack structure and configured to guide light to optically excite the quantum dots included in the plurality of QD-containing layers,
wherein the stack structure is disposed between the nano-antenna structure and the light source or the optical waveguide.

18. The optical modulating device of claim 17, further comprising:
a reflector provided on the light source or the optical waveguide; and
a band-stop mirror provided between the stack structure and the nano-antenna structure.

19. An optical apparatus comprising the optical modulating device of claim 1.

20. The optical modulating device of claim 16, wherein the nano-antenna structure further comprises an input coupler.

21. An optical modulating device comprising:
a plurality of refractive index change layers; and
a plurality of quantum dot (QD)-containing layers disposed between the plurality of refractive index change layers, the plurality of QD-containing layers comprising quantum dots (QDs), and at least two of the plurality of QD-containing layers having central emission wavelengths that are different from each other,
wherein the optical modulating device is configured to modulate, based on a refractive index change of the plurality of refractive index change layers, light emission characteristics of the plurality of QD-containing layers to have characteristics of emitting light of a plurality of wavelength regions.

22. The optical modulating device of claim 21, wherein at least two of the plurality of refractive index change layers comprise materials that different from each other or have carrier densities that are different from each other.

23. The optical modulating device of claim 21, wherein the plurality of refractive index change layers and the plurality of QD-containing layers form a stack structure,
the optical modulating device further comprises a light source provided on a surface of the stack structure and configured to emit light to optically excite quantum dots included in the plurality of QD-containing layers, or an optical waveguide provided on the surface of the stack structure and configured to guide light to optically excite the quantum dots included in the plurality of QD-containing layers.

24. The optical modulating device of claim 21, wherein the plurality of refractive index change layers and the plurality of QD-containing layers form a stack structure,
wherein the optical modulating device further comprises:
a reflector provided on a first surface of the stack structure; and
a band-stop mirror provided on a second surface, opposite from the first surface, of the stack structure.

25. An optical apparatus comprising the optical modulating device of claim 21.

26. An optical modulating device comprising:
a plurality of refractive index change layers;
a plurality of quantum dot (QD)-containing layers disposed between the plurality of refractive index change layers, respectively; and
a signal application device configured to apply an electrical signal to the plurality of refractive index change layers, respectively,
wherein the optical modulating device is configured to:
change refractive indexes of the plurality of refractive index change layers based on the electrical signal applied by the signal application device to the plurality of refractive index change layers; and modulate light-emission characteristics of each of the plurality of QD-containing layers based on the changed refractive indexes of the plurality of refractive index change layers, wherein the plurality of QD-containing layers comprise a first QD-containing layer and a second QD-containing layer, the first QD-containing layer comprising first quantum dots and the second QD-containing layer comprising second quantum dots, and the first quantum dots and the second quantum dots comprise materials that are different from each other and/or have sizes that are different from each other.

27. The optical modulating device of claim 26, wherein each of the first quantum dots and the second quantum dots are embedded in an insulating layer.

28. The optical modulating device of claim 26, wherein the plurality of refractive index change layers and the plurality of QD-containing layers form a stack structure, the optical modulating device further comprising a nano-antenna structure disposed on a surface of the stack structure.

\* \* \* \* \*